United States Patent

Sukegawa et al.

[11] Patent Number: 5,841,688
[45] Date of Patent: Nov. 24, 1998

[54] MATCHED DELAY WORD LINE STRAP

[75] Inventors: Shunichi Sukegawa, Ibaraki, Japan;
Hugh P. McAdams, McKinney, Tex.;
Tadashi Tachibana, Tsuchiura, Japan;
Katsuo Komatsuzaki, Ibaraki, Japan;
Takeshi Sakai, Ohme, Japan

[73] Assignee: Texas Instruments Incorporated, Dallas, Tex.

[21] Appl. No.: 883,738

[22] Filed: Jun. 27, 1997

[51] Int. Cl.$^6$ .................................................. G11C 5/00
[52] U.S. Cl. ........................... 365/63; 365/72; 365/52; 365/61; 257/758; 257/767
[58] Field of Search .................................. 365/63, 72, 52, 365/61, 194; 257/758, 767, 774

[56] References Cited

U.S. PATENT DOCUMENTS

| 5,760,476 | 6/1998 | Varker et al. | 257/758 |
| 5,760,477 | 6/1998 | Cronin | 257/758 |
| 5,767,546 | 6/1998 | Williams et al. | 257/774 |
| 5,768,174 | 6/1998 | Seo et al. | 365/63 |

*Primary Examiner*—Tan T. Nguyen
*Attorney, Agent, or Firm*—Robert N. Rountree; Lawrence J. Bassuk; Richard L. Donaldson

[57] ABSTRACT

A circuit is designed with a first lower conductor (500) having two ends. One end of the first lower conductor is coupled to a first signal source (386). A first upper conductor (544) has two ends and is spaced apart from the first lower conductor by a distance less than an allowable spacing between adjacent lower conductors. One end of the first upper conductor is coupled to a second signal source (384). A second upper conductor (508) has two ends. One end of the second upper conductor is coupled to another end of the first lower conductor for receiving a signal from the first signal source. A second lower conductor (552) has two ends and is spaced apart from the second upper conductor by a distance less than the allowable spacing between adjacent lower conductors. One end of the second lower conductor is coupled to another end of the first upper conductor for receiving a signal from the second signal source. Since the upper and lower conductors are spaced apart by a distance less than an allowable spacing between adjacent lower conductors, layout area is conserved. Total resistance of conductors connected to each signal source is the same, so signal delay is the same.

21 Claims, 9 Drawing Sheets

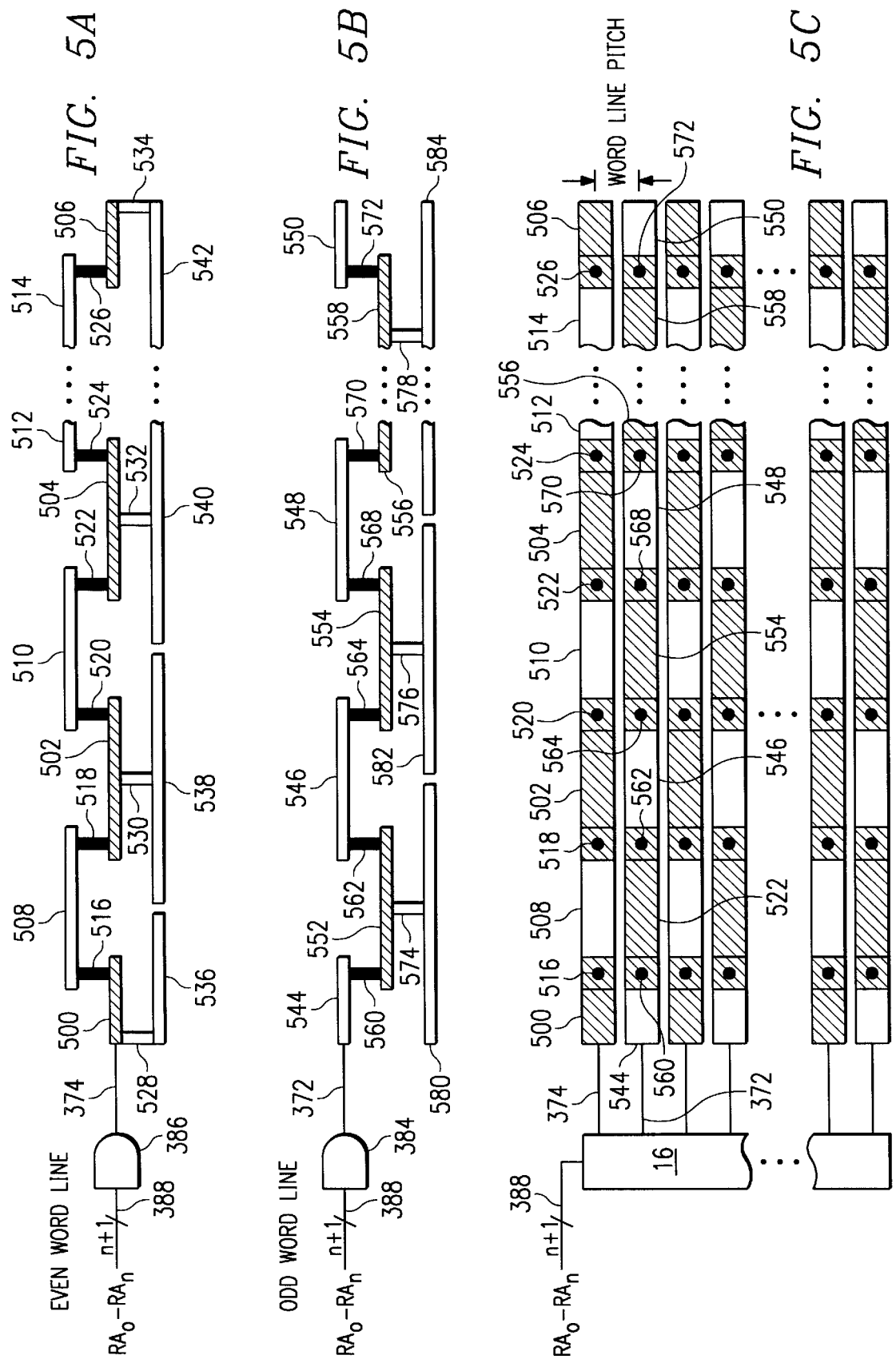

MATCHED DELAY WORD LINE STRAP

FIELD OF THE INVENTION

This invention relates to an integrated circuit and more particularly to an integrated circuit including a word line strap circuit.

BACKGROUND OF THE INVENTION

Present complementary metal oxide semiconductor (CMOS) dynamic random access memory (DRAM) circuits are frequently used for main memory in a variety of applications including desk top and portable computer systems. Advances in processor design and software development require dynamic random access memory circuits with high density and fast access time for main memory. A significant part of total access time of a dynamic random access memory circuit is due to word line transition time from a low voltage to a high voltage. This word line transition time is limited by a product of resistance and capacitance associated with the word line.

Previous memory circuits have employed a metal strap or shunt in parallel with a polycrystalline silicon word line to reduce the total word line resistance, thereby reducing the total access time of the dynamic random access memory circuit. In FIG. 12A, a word line strap 1200 is coupled between a row decode AND gate 386 and each of polycrystalline word line segments 1210–1216 by contacts 1204–1208 to reduce total resistance of the word line. However, a. problem with this method arises when the minimum pitch (metal width plus metal-to-metal space) of the metal word line strap is greater than the pitch of memory cells of the dynamic random access memory circuit. If the pitch of word line straps is reduced below the capability of manufacturing equipment, functional yield of the dynamic random access memory circuits is greatly reduced due to shorted metal lines.

Other dynamic random access memory circuits have employed two-level metal straps to reduce the word line strap to the pitch of the memory cells. In FIG. 12A, a lower metal conductor 1200 is coupled between a row decode AND gate 386 and each of polycrystalline word line segments 1210–1216 by contacts 1204–1208 for even word lines. In FIG. 12B, an upper metal conductor 1220 is coupled between a row decode AND gate 384 and each of polycrystalline word line segments 1230–1236 by contacts 1224–1228 for odd word lines. The resulting structure (FIG. 12C) greatly reduces the pitch of the word line strap without reducing functional yield of the dynamic random access memory circuits. However, another problem arises with this method due to a difference in resistance between the lower and upper metal conductors.

The circuit of FIG. 10A was used to simulate a word line transition time between inverter 1002 and an end of polycrystalline silicon segment 1014 for two resistance values of word line strap 1004, representing the resistance of a lower metal conductor and an upper metal conductor, respectively. For a word line having eight polycrystalline silicon segments 1012, the difference between waveform 1102 for a lower metal conductor and waveform 1104 for an upper metal conductor at 2.8 volts is 6 nanoseconds (FIG. 11). For a word line 1024 having sixteen polycrystalline silicon segments 1032 (FIG. 10B) and the same number of memory cells, waveforms 1103 and 1105 (FIG. 11), respectively, show that a difference of access times between odd and even word lines is still 6 nanoseconds. This degrades circuit performance, because peak current required to charge the word line is determined by word lines having a low resistance strap while access time of the dynamic random access memory circuit is determined by word lines having a higher resistance strap.

SUMMARY OF THE INVENTION

These problems of reducing word line strap pitch, peak current and access time are resolved by a circuit including a first lower conductor having two ends. One end of the first lower conductor is coupled to a first signal source. A first upper conductor having two ends is spaced apart from the first lower conductor by a distance less than an allowable spacing between adjacent lower conductors. One end of the first upper conductor is coupled to a second signal source. A second upper conductor has two ends. One end of the second upper conductor is coupled to another end of the first lower conductor for receiving a signal from the first signal source. A second lower conductor has two ends. The second lower conductor is spaced apart from the first upper conductor by a distance less than the allowable spacing between adjacent lower conductors. One end of the second lower conductor is coupled to another end of the first upper conductor for receiving a signal from the second signal source.

The present invention uses lower and upper conductors to shunt a word line, thereby reducing word line pitch and transition time. Peak current and word line delay are substantially equal for odd and even word lines.

BRIEF DESCRIPTION OF THE DRAWINGS

A more complete understanding of the invention may be gained by reading the subsequent detailed description with reference to the drawings wherein:

FIG. 5A is a diagram of an embodiment of the present invention for even word lines;

FIG. 5B is a diagram of an embodiment of the present invention for odd word lines;

FIG. 5C is a diagram of an embodiment of the present invention showing odd and even word lines;

DETAILED DESCRIPTION OF THE PREFERRED EMBODIMENTS

Figure 1:
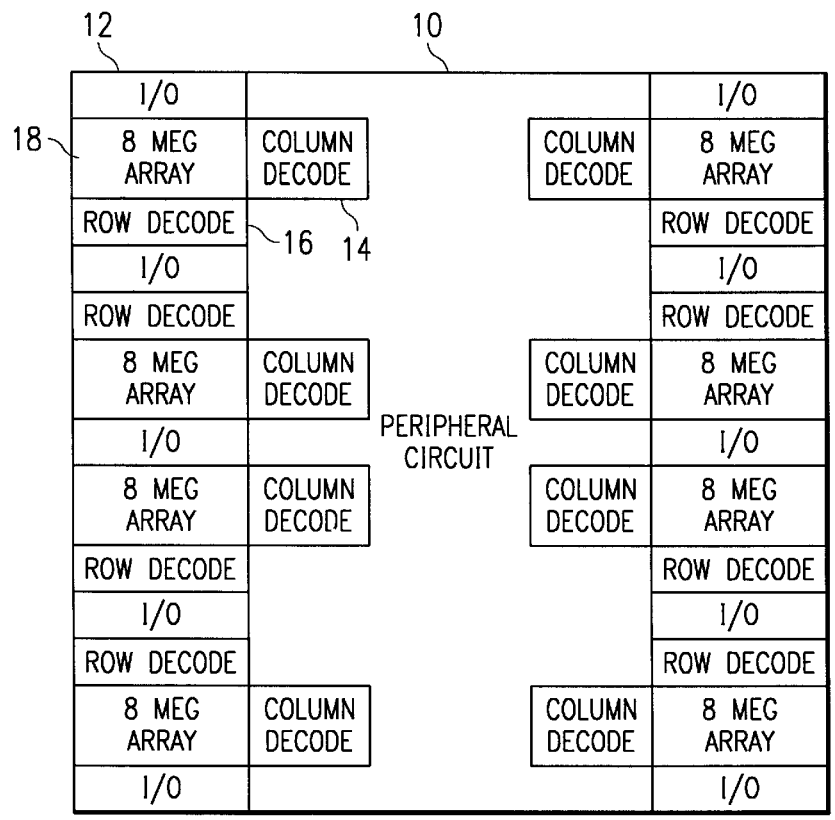
FIG. 1 is a diagram of a 64 megabit dynamic random access memory having an embodiment of the present invention.

Referring now to FIG. 1, there is a block diagram of a 64 megabit dynamic random access memory circuit. The memory circuit is organized into eight 8 megabit arrays 18 of memory cells. Each 8 megabit array has a column decode circuit 14 and a row decode circuit 16 for selecting plural memory cells from the 8 megabit array. An input-output (I/O) circuit 12 conducts data between the plural memory cells and output terminals (not shown) within a peripheral circuit 10.

Figure 2:
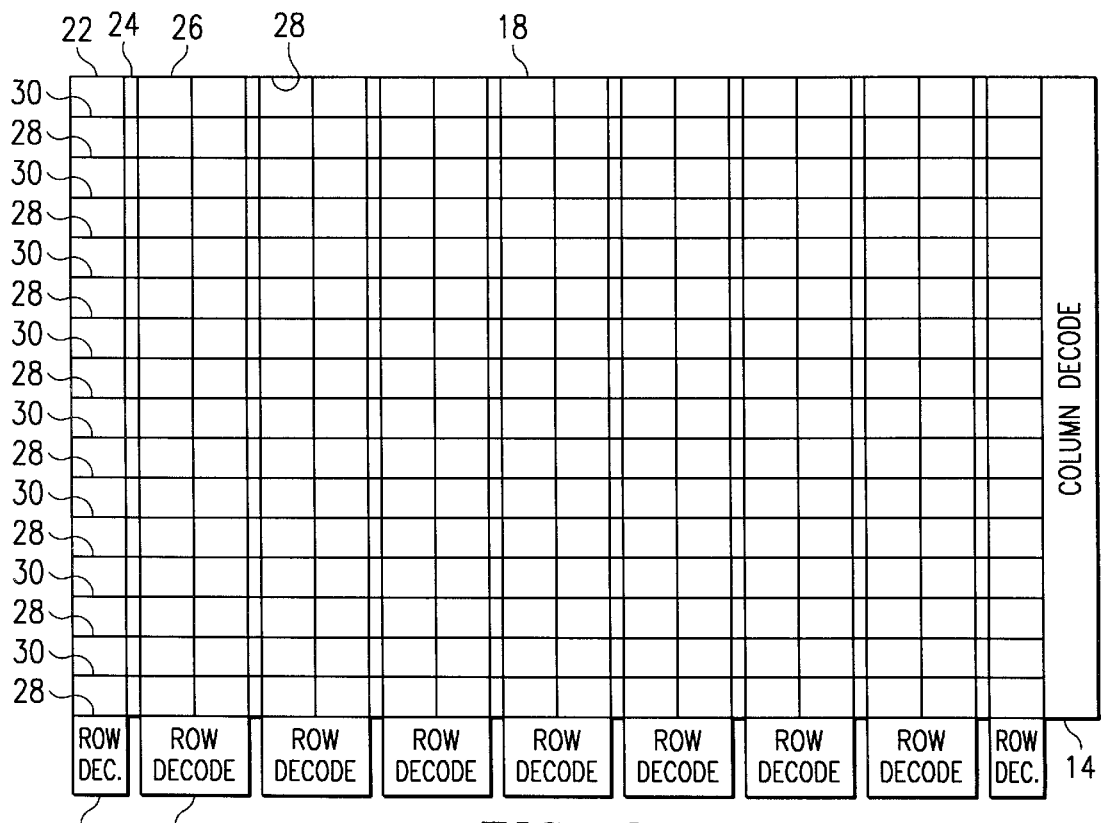
FIG. 2 is a diagram of an 8 megabit array of the 64 megabit dynamic random access memory of FIG. 1.

An expanded view of the 8 megabit array 18, and column 14 and row 16 decode circuits is shown in FIG. 2. The 8 megabit array is further divided into eight 1 megabit memory banks. Each 1 megabit memory bank includes a sense amplifier bank 24 and left 22 and right 26 memory arrays. Word lines (not shown) extend parallel to sense amplifier banks 24 from row decode circuits 16 through left 22 and right 26 memory arrays. Each row decode circuit 16 is a signal source for a word line that selectively activates a respective row of more than 8192 memory cells, including redundant memory cells (not shown), within the left 22 or right 26 memory arrays. It is highly advantageous to reduce signal delay time from the row decode circuit 16, along the respective word line to the more than 8192 memory cells, thereby reducing time required to read data from or write data to selectively activated memory cells. Thus, word lines are periodically strapped or shunted as indicated at 28 and 30 with metal conductors to reduce word line resistance, thereby reducing the product of word line resistance and capacitance. This reduction of word line resistance and capacitance greatly reduces signal delay along the respective word line and resulting data access time of the 64 megabit dynamic random access memory.

Figure 3:
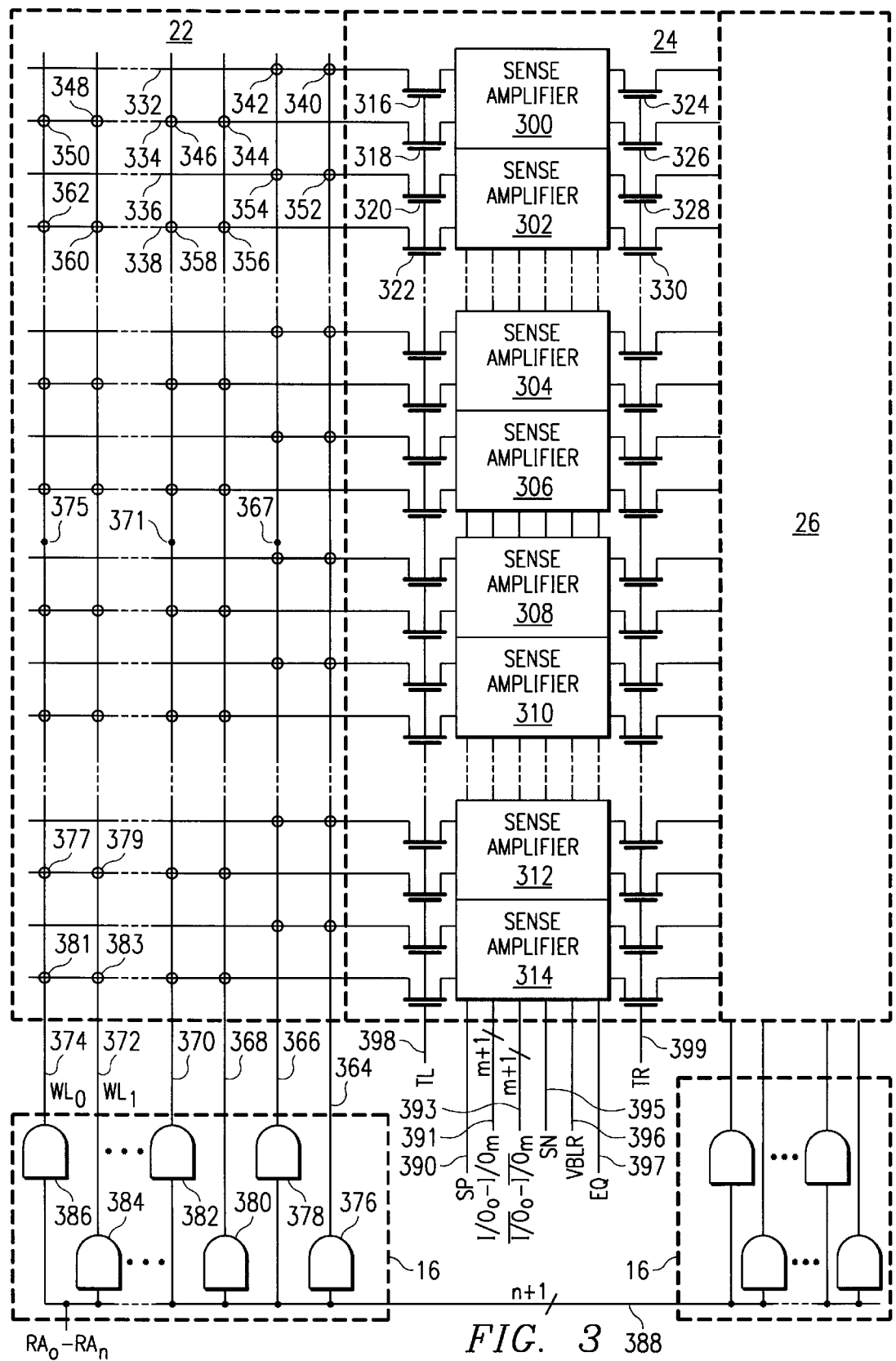
FIG. 3 is a schematic diagram of an octant of the 8 megabit array of FIG. 2.

Referring now to FIG. 3, there is a schematic diagram of sense amplifier bank 24 and left 22 and right 26 memory arrays. Row decode circuits 16 include AND gates 376–386 that are responsive to row address signals $RA_0$–$RA_n$ at bus 388 for activating a selected word line. These row address signals $RA_0$–$RA_n$ may be predecoded minterms or maxterms of external row address signals as is well known in the art. Each of AND gates 384 and 386, for example, correspond to word lines 372 and 374, respectively. Memory cells 348 and 350, at the extreme ends of word lines $WL_1$ 372 and $WL_0$ 374, respectively, experience a greater signal delay than other memory cells closer to the row decode circuits 16. Even word line $WL_0$ 374 is strapped at multiple locations 28 (FIG. 2) and odd word line $WL_1$ 372 is strapped at multiple locations 30 to reduce word line resistance. Word line strap location 28 has a contact 375 (FIG. 3) for coupling a lower metal conductor of word line $WL_0$ 374 to a polycrystalline silicon gate for memory cells 350 and 362. Corresponding contacts (not shown) for $WL_1$ 372 are at multiple locations 30.

Figure 4:
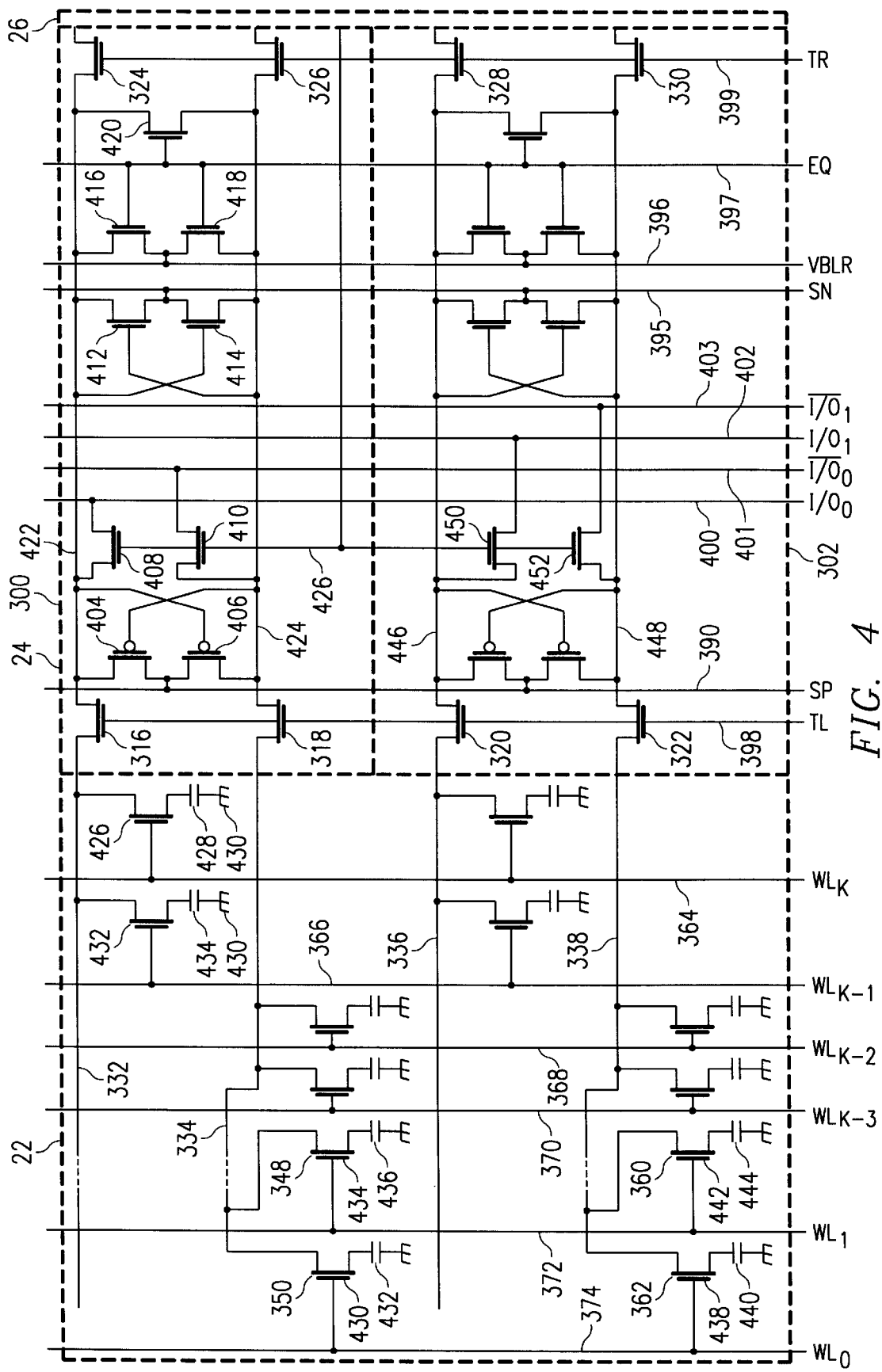
FIG. 4 is a schematic diagram showing memory cells and sense amplifiers from the octant of FIG. 3.

Referring now to FIG. 4, there is a schematic diagram of sense amplifiers 300 and 302 and their respective memory cells. During a read cycle, word line $WL_0$ 374, for example, is activated by a selection signal from AND gate 386 (FIG. 3). Memory cell 350 (FIG. 4), including transistor 430 and capacitor 432, is only selected after a time required for the selection signal to propagate to the extreme end of word line $WL_0$ 374. Thus, the propagation delay along word line $WL_0$ 374 directly increases time required to activate a memory cell 350 in a read cycle. It is therefore highly advantageous to minimize this propagation delay by strapping or shunting word lines according to the instant invention to reduce memory access time.

After word line $WL_0$ 374 selects memory cell 350, transistor 430 conducts and couples a datum from capacitor 432 to bit line 334. The datum is coupled to sense amplifier 300 by transistor 318. A difference voltage between terminals 422 and 424, indicative of the datum, is amplified by sense amplifier 300. In a like manner, transistor 438 conducts, responsive to $WL_0$ 374, and couples another datum from capacitor 440 to terminal 448 for amplification by sense amplifier 302. Column decode circuit 14 (FIG. 2) selectively produces a column select signal at terminal 426, responsive to column address signals (not shown), for coupling the data from sense amplifiers 300 and 302 (FIG. 4) to complementary data lines $I/O_0$ 400, and $\overline{I/O}_0$ 401, $I/O_0$ 402 and $\overline{I/O}_1$ 403, respectively. The data is subsequently coupled to I/O circuit 12 (FIG. 1) and, eventually, to other circuits external to the dynamic random access memory.

Referring now to FIG. 5A, there is a diagram of an even word line such as, for example, $WL_0$ 374 corresponding to a row of memory cells according to an embodiment of the instant invention. Row decode source AND gate 386 is coupled to lower metal conductor 500 which is coupled to polycrystalline silicon word line half segment 536 through contact 528. Polycrystalline silicon word line half segment 536 forms a gate for memory cells in the respective row including memory cells 377 and 381 (FIG. 3). Lower metal conductor 500 (FIG. 5A) is further coupled to lower metal conductor 502 through upper metal conductor 508 and vias 516 and 518, respectively. Lower metal conductor 502 is coupled to polycrystalline silicon word line segment 538 through contact 530. Polycrystalline silicon word line segment 538 forms a gate for other memory cells in the respective row. This pattern is repeated to polycrystalline silicon word line half segment 542 the extreme end of $WL_0$ 374, which forms a gate for memory cells in the respective row including memory cells 350 and 362 (FIG. 3), respectively.

Referring now to FIG. 5B, there is a diagram of an odd word line such as, for example, $WL_1$ 372 corresponding to a row of memory cells according to an embodiment of the instant invention. Row decode AND gate 384 is coupled to upper metal conductor 544 which is coupled to lower metal conductor 552 through via 560. Lower metal conductor 552 is coupled to polycrystalline silicon word line segment 580 through contact 574. Polycrystalline silicon word line segment 580 forms a gate for memory cells in the respective row including memory cells 379 and 383 (FIG. 3). This pattern is repeated to polycrystalline silicon word line segment 584 (FIG. 5B) at the extreme end of word line $WL_1$ 372, which forms a gate for memory cells in the respective row including memory cells 348 and 360 (FIG. 3), respectively.

Referring now to FIG. 5C, there is a diagram of a top view of even and odd word line straps as in FIG. 5A and FIG. 5B, respectively. Even word line strap $WL_0$ 374, for example, includes two lower metal conductor half segments 500 and 506 at either end, fifteen lower metal conductor segments 502–504 and sixteen upper metal conductor segments 508–514 connected in series. In a similar manner odd word line strap $WL_1$ 372, for example, includes two upper metal conductor half segments 544 and 550 at either end, fifteen upper metal conductor segments 546–548 and sixteen lower metal conductor segments 552–558 connected in series. This arrangement is highly advantageous for several reasons. First, the total resistance of both odd and even word line straps is the same even if the resistance of lower metal conductor segments is substantially greater than the resistance of upper metal conductor segments. Thus, access time for memory cells on odd and even rows is the same. Second, it is possible to contact polycrystalline silicon segments on both odd and even word lines from lower metal conductors only. This avoids the need to make contacts directly from an upper metal conductor directly to a polycrystalline silicon segments, a step that may be less reliable due to a greater aspect ratio (depth to diameter) of the contact. Finally, for a substantial part of the length of a word line strap, the adjacent word line strap is formed of a different metal conductor. Close spacing between like metal conductors only occurs at relatively smaller overlap regions where vias, for example vias 516 and 560, are formed. Thus, the probability of shorting adjacent word line straps during fabrication is greatly reduced. Moreover, word line strap pitch (the distance between center lines) may be less than a minimum allowable pitch for metal lines formed of the same metal without a corresponding decrease in reliability. This minimum allowable pitch includes a minimum allowable width and a minimum allowable space for like metal lines, below which reliability of the manufacturing process is compromised by an increased probability of shorted or open metal lines. Such minimum allowable feature sizes are characterized by a substantial occurrence on a 64 megabit dynamic random access memory or other device.

Figure 6A:
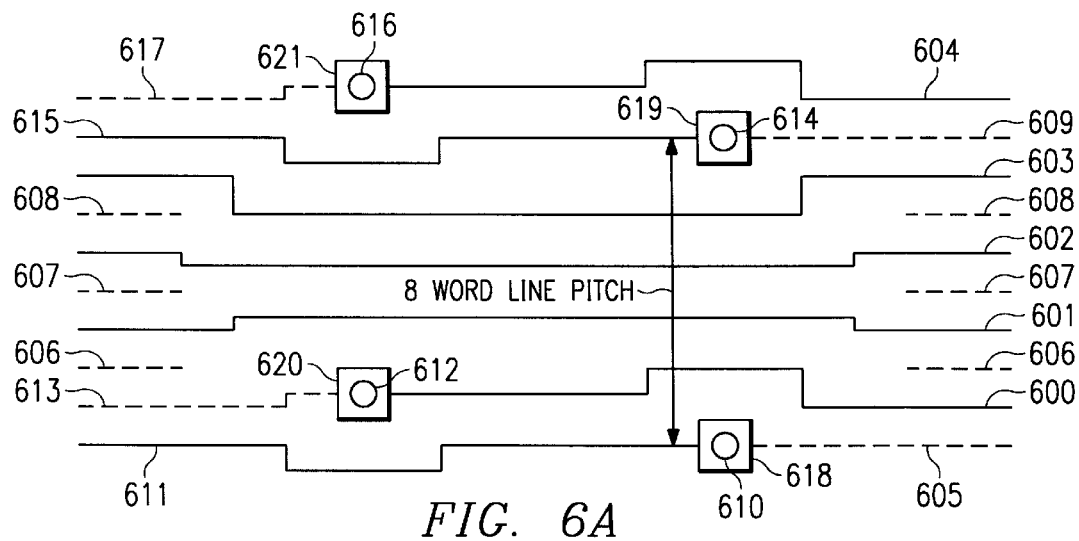
FIG. 6A is a routing diagram of an embodiment of the present invention.

Referring now to FIG. 6A, there is a diagram showing a routing technique that obviates the need for close spacing between like metal conductors at, for example vias 516 and 560 (FIG. 5C). Here, upper metal conductor 605 and lower metal conductor 611 are connected by via 610 at overlap region 618 (FIG. 6A). Adjacent lower metal conductor 600 and upper metal conductor 613 are connected by via 612 at overlap region 620. Connection points for the next six word line straps 601–603 and 606–608 are displaced with respect to connection points for word line straps 600 and 605. The pattern of eight word line straps is repeated with word line straps 604 and 609, which correspond to word line straps 600 and 605, respectively. For example, a minimum 8 word line strap pitch includes the width of one via (0.36 μm), two lower metal conductor overlaps of the via (2*0.15 μm), four lower metal conductor widths (4*0.3 μm) and five spaces between lower metal conductors (5*0.3 μm) for a total of 3.36 μm. Thus, a single word line pitch according to the instant invention may be 3.36/8 μm or 0.42 μm. This is substantially less than a comparable minimum word line strap pitch (0.3 μm width plus 0.3 μm space) for a single metal conductor. Alternatively, if a single word line pitch is greater than 0.42 μm but less than 0.6 μm, spacing between like metal conductors may be appropriately increased to improve reliability.

In a similar manner, a word line pitch may be further reduced by repeating a word line crossover pattern every 16 word lines. A minimum 16 word line strap pitch includes the width of one via (0.36 μm), two lower metal conductor overlaps of the via (2*0.15 μm), eight lower metal conductor widths (8*0.3 μm) and nine spaces between lower metal conductors (9*0.3 μm) for a total of 5.76 μum. Thus, a single word line pitch may be further reduced to 5.76/16 μm or 0.36 μm.

The total length of a region required for displaced connection points is typically less than twenty percent of the length of a metal conductor segment. Thus, adjacent lower and upper metal conductor segments, for example 600 and 605, are substantially equal in length. Overlap regions 618 and 620 are spaced apart and adjacent like metal conductors 600 and 611, respectively, are offset to maintain at least a desired minimum space between like metal conductors even if the word line strap pitch is less than an allowable pitch for either upper or lower like metal conductors. This significantly improves the reliability of metal interconnection during fabrication by permitting like metal conductors to be spaced apart a distance greater than a minimum allowable spacing for like metal conductors even if the word line pitch is less than the minimum allowable spacing for like metal conductors. Moreover, displacement of connection points between upper and lower metal conductors with respect to other connection points takes place over memory cell arrays, for example 22 and 26 (FIG. 2), so no additional layout area is required.

Figure 8A:
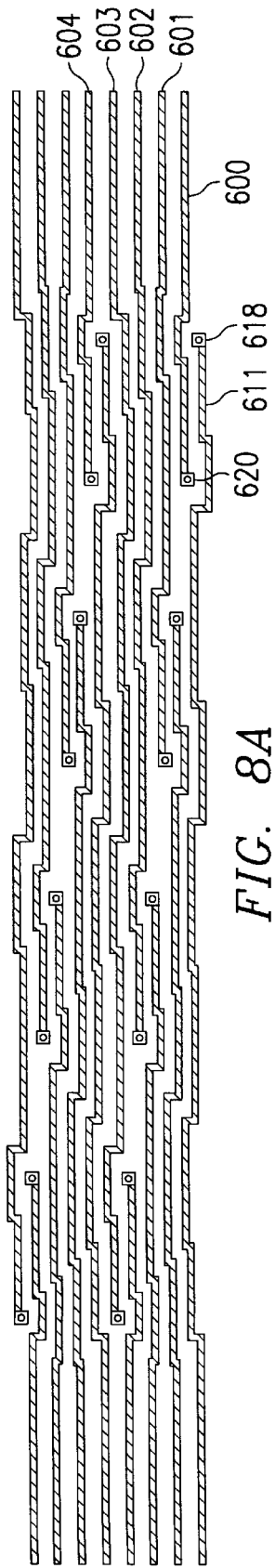
FIG. 8A is a layout diagram of an embodiment of the present invention for a lower conductor.
Figure 8B:
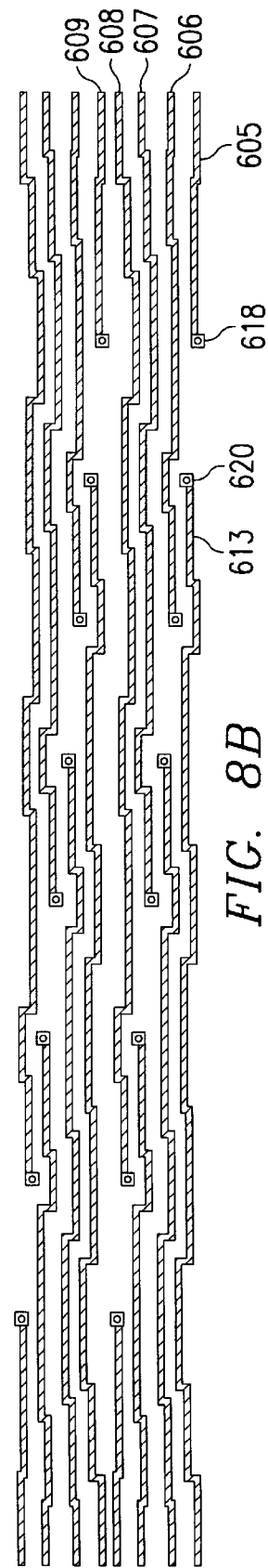
FIG. 8B is a layout diagram of an embodiment of the present invention for an upper conductor.
Figure 8C:
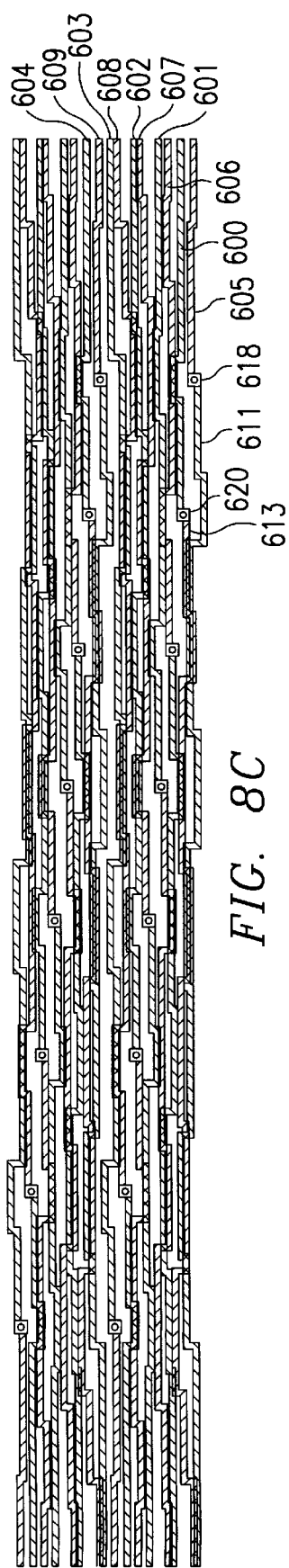
FIG. 8C is a layout diagram of an embodiment of the present invention showing lower and upper conductors.

Referring now to FIG. 8A, there is a diagram showing an actual layout of a lower metal conducting layer corresponding to the diagram of FIG. 6A. The diagram of FIG. 8B shows an actual layout of an upper metal conducting layer corresponding to the diagram of FIG. 6A. Finally, the diagram of FIG. 8C shows a layout of the combined lower and upper metal conducting layers of FIG. 8A and FIG. 8B, respectively, having corresponding numerals throughout.

Figure 9A:
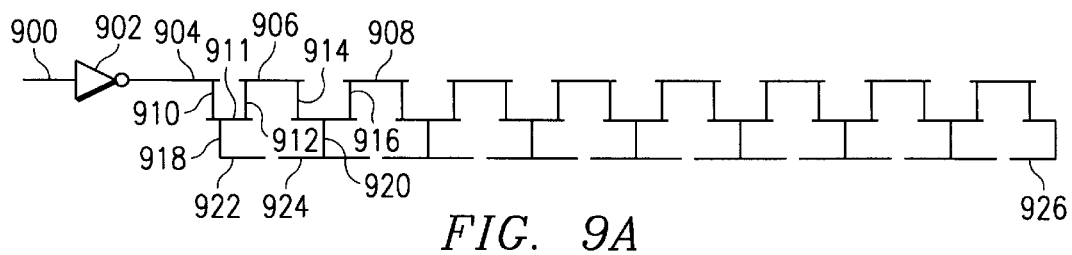
FIG. 9A is a diagram of a circuit for simulating an embodiment of the present invention.
Figure 9B:
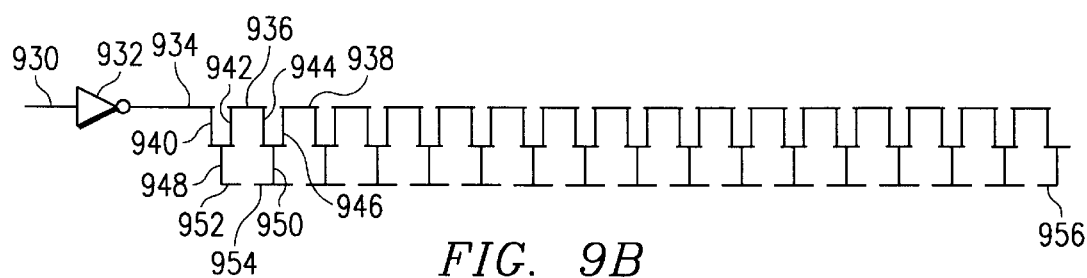
FIG. 9B is a diagram of a circuit for simulating another embodiment of the present invention.
Figure 10A:
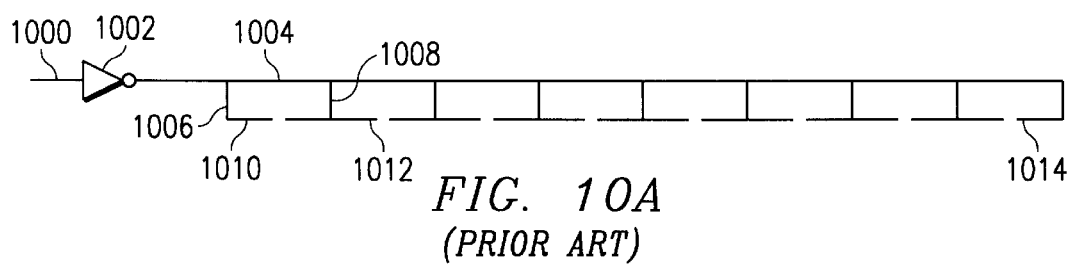
FIG. 10A is a diagram of a circuit of prior art.
Figure 10B:
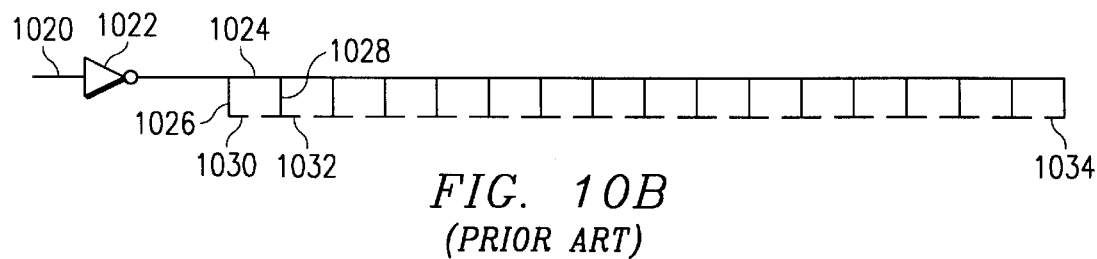
FIG. 10B is another diagram of a circuit of prior art.

Referring now to FIG. 9A and 9B, there are diagrams of circuits, including parasitic resistance and capacitance of interconnection segments and memory cell capacitance (not shown), used for simulating embodiments of the instant invention. The circuit of FIG. 9A is a model of a word line having eight upper metal conductors. The circuit of FIG. 9B is a model of a word line having sixteen upper metal conductors. Each word line further includes a corresponding number of lower metal conductors and polycrystalline silicon segments, but each word line has the same total number of memory cells. Here, inverter 902 (FIG. 9A) and inverter 932 (FIG. 9B) are signal sources corresponding to a row decode circuit, for example AND gate 386 (FIG. 5A).

Figure 11:
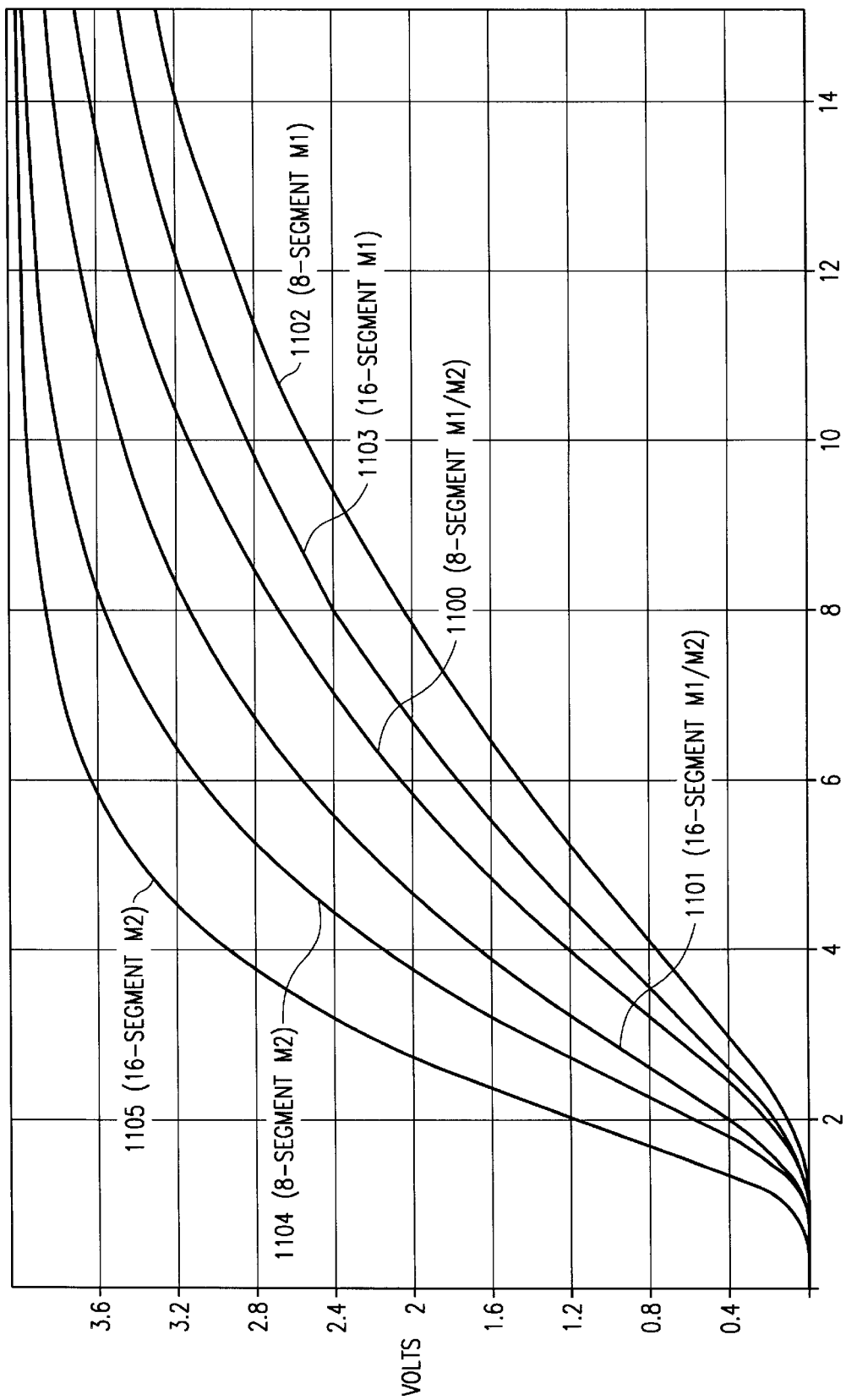
FIG. 11 is a diagram showing simulation waveforms of embodiments of the present invention and of prior art.
Figure 12A:
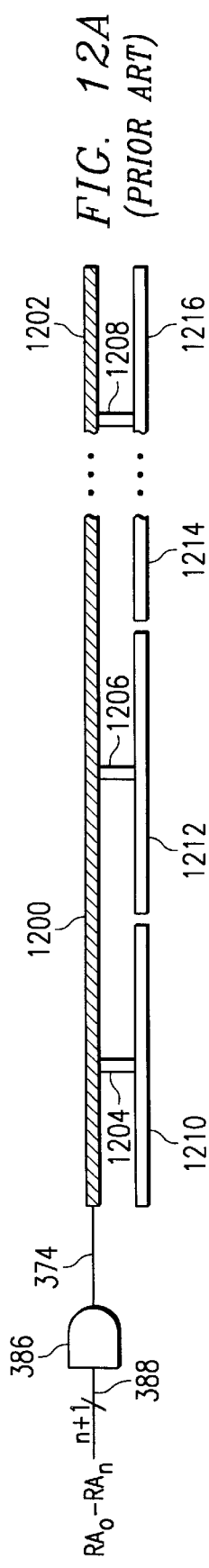
FIG. 12A is a diagram of an embodiment of prior art for even word lines.
Figure 12B:
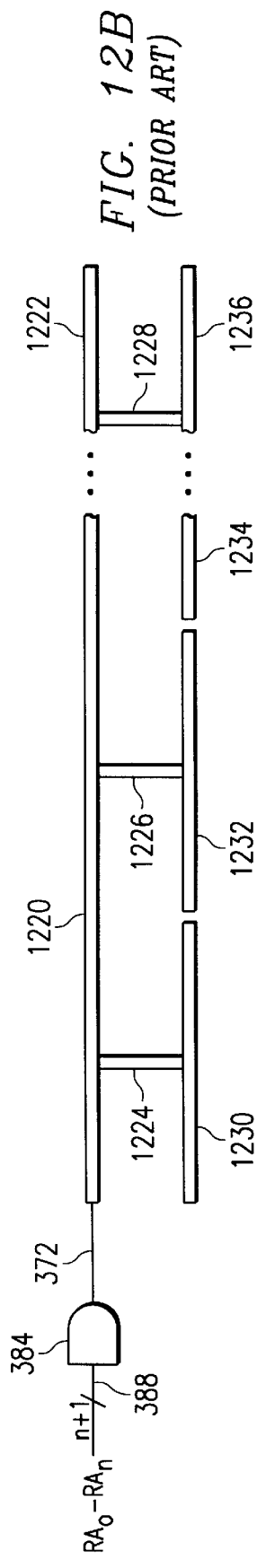
FIG. 12B is a diagram of an embodiment of prior art for odd word lines.
Figure 12C:
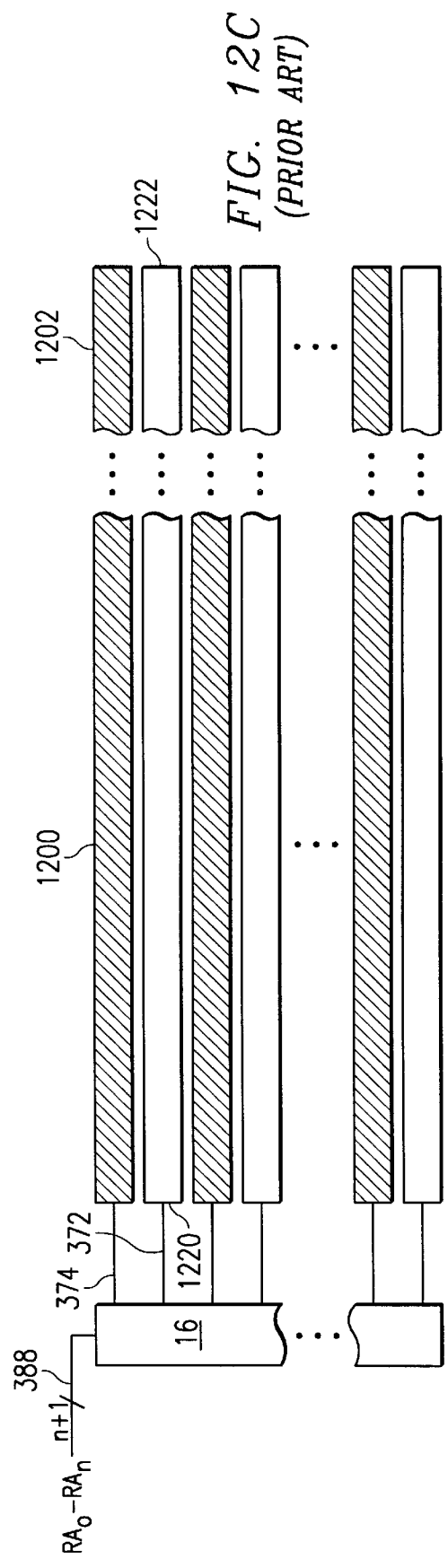
FIG. 12C is a diagram of an embodiment of prior art showing odd and even word lines.

Simulation results for the circuit of FIG. 9A and FIG. 9B are shown in FIG. 11. The simulation begins when signals at input terminals 900 and 930 of inverters 902 and 932, respectively, make simultaneous transitions from a logical high level to a logical low level at a starting time of zero. Waveforms 1100 and 1101 represent a resulting voltage at the extreme end of polycrystalline segments 926 and 956, respectively. Waveform 1101 compared to waveform 1100 shows that the circuit of FIG. 9B, having sixteen segments, offers an advantage of 1.5 nanoseconds at 2.8 volts over the circuit of FIG. 9A. Moreover, a comparison of waveforms 1101 and 1100 to waveforms 1103 and 1102, respectively, shows that each of the circuits of FIG. 9A and FIG. 9B offers an advantage of 3 nanoseconds at 2.8 volts over a more resistive single metal conductor of prior art in FIG. 12C. For a dynamic random access memory having, for example, a 50 nanosecond access time (tRAC), this represents an improvement of six percent. Thus, significant improvements in reliability and access time accrue from these embodiments of the instant invention.

Figure 6B:
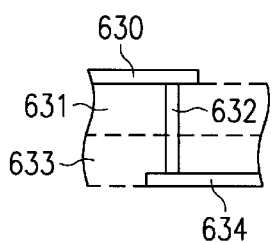
FIG. 6B is a diagram of an embodiment of a via structure of the present invention.
Figure 6C:
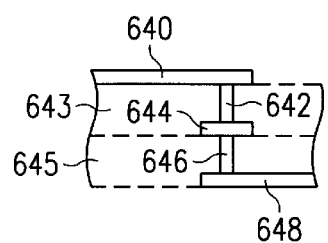
FIG. 6C is a diagram of another embodiment of a via structure of the present invention.
Figure 6D:
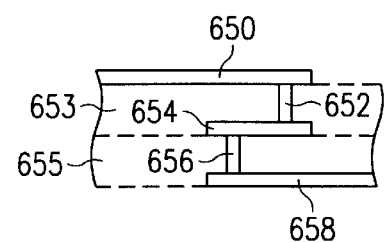
FIG. 6D is a diagram of yet another embodiment of a via structure of the present invention.
Figure 7:
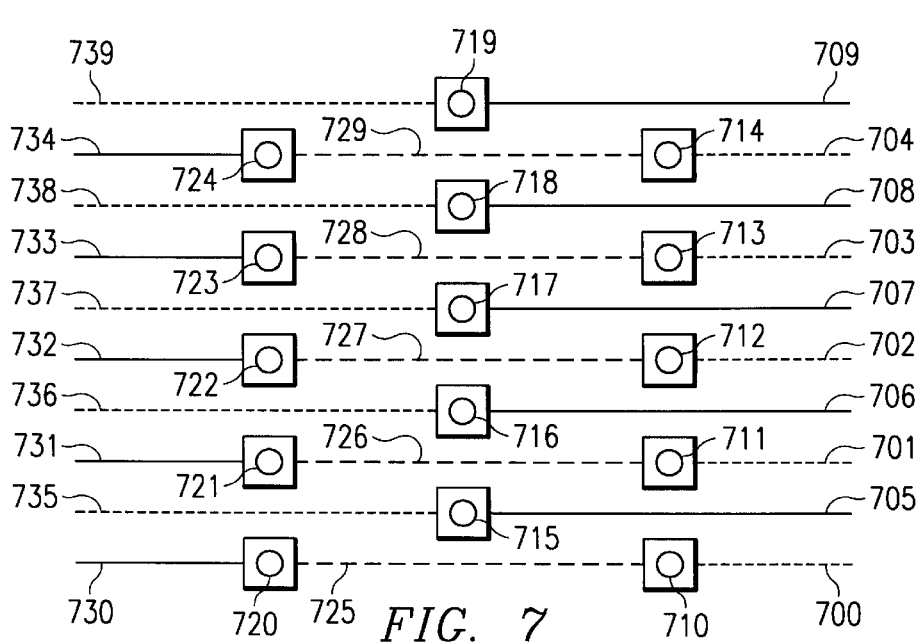
FIG. 7 is a routing diagram of another embodiment of the present invention.

Although embodiments of the invention have been described in detail with reference to preferred embodiments, it is to be understood that the foregoing description is by way of example only and is not to be construed in a limiting sense. For example, upper and lower metal conductor segments may be connected according to the routing diagram of FIG. 7 where three conducting layers are available. A connection point for one word line strap has a first metal conductor segment 709 connected to third metal conductor segment 739 at via 719. An adjacent word line strap has two connection points at vias 724 and 714, respectively. A first metal conductor segment 734 is connected to a second metal conductor segment 729 at via 724. The second metal conductor segment 729 is connected to a third metal conductor segment 704 at via 714. Direct connection between first 634 and third 630 metal conductor segments (FIG. 6B) may be realized by standard etch techniques through first 633 and second 631 insulating layers and subsequent deposition of a conformal metal such as tungsten or other conductive material to form via 632. In another embodiment, first 648 and third 640 metal conductor segments are connected through a second metal conductor segment 644 by patterning one via 642 directly above another via 646 (FIG. 6C). In another embodiment, first 658 and third 650 metal conductor segments may connected through a second metal conductor segment 654 by displacing one via 652 with respect to another via 656 (FIG. 6D). In yet another embodiment, the instant invention may be used for any interconnection application to reduce layout area by reducing the pitch of adjacent conductors while improving reliability by maintaining at least a minimum allowable spacing between adjacent like metal conductors. This embodiment of the instant invention is realized by omission of contacts and polycrystalline word line segments (FIG. 5A and FIG. 5B). Such applications include wide data and address bus circuits for memory and microprocessor devices.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit comprising:
   a first lower conductor having two ends, one end of the first lower conductor being coupled to a first signal source;
   a first upper conductor having two ends, the first upper conductor being spaced apart from the first lower conductor by a distance less than an allowable spacing between adjacent lower conductors, one end of the first upper conductor being coupled to a second signal source;
   a second upper conductor having two ends, one end of the second upper conductor being coupled to another end of the first lower conductor for receiving a signal from the first signal source; and
   a second lower conductor having two ends, the second lower conductor being spaced apart from the second upper conductor by a distance less than the allowable spacing between adjacent lower conductors, one end of the second lower conductor being coupled to another end of the first upper conductor for receiving a signal from the second signal source.

2. A circuit as in claim 1, wherein the first lower conductor is separated from the second upper conductor and the first upper conductor is separated from the second lower conductor by an insulating layer.

3. A circuit as in claim 2, further comprising a third conductor coupled to the first lower conductor and a fourth conductor coupled to the second lower conductor.

4. A circuit as in claim 3, wherein each of the third and fourth conductors are connected to a plurality of memory cells, each memory cell comprising at least one MOS transistor, the MOS transistor having a gate connected to the respective third and fourth conductor.

5. A circuit as in claim 4, wherein the third and fourth conductors comprise polycrystalline silicon word lines, the polycrystalline silicon word lines having a pitch less than the allowable spacing between adjacent lower conductors.

6. A circuit as in claim 2, wherein the first lower conductor and the first upper conductor are parallel to each other for a substantial part of the length of the first upper conductor, and the second upper conductor and the second lower conductor are parallel to each other for a substantial part of the length of the second upper conductor.

7. A circuit as in claim 6, wherein the first lower conductor and the first upper conductor are spaced apart by a distance greater than the thickness of the insulating layer for a substantial part of the length of the first upper conductor.

8. A circuit as in claim 7, wherein the first lower conductor and the first upper conductor are spaced apart by a distance equal to the thickness of the insulating layer for a substantial part of the length of the first upper conductor.

9. A circuit as in claim 2, wherein the first lower conductor is coupled to the second upper conductor through a first hole in the insulating layer and wherein the first upper conductor is coupled to the second lower conductor through a second hole in the insulating layer.

10. A circuit as in claim 9, wherein the first lower conductor is coupled to the second upper conductor by a third conductor and the first upper conductor is coupled to the second lower conductor by a fourth conductor, the third and fourth conductors having different material properties than the first and second upper conductors.

11. A circuit comprising:
   a first lower conductor having two ends and a length therebetween, one end of the first lower conductor being coupled to a first signal source;
   a first upper conductor having two ends and a length therebetween, the first upper conductor being parallel to the first lower conductor for a substantial part of the length of the first upper conductor, one end of the first upper conductor being coupled to a second signal source;
   a second upper conductor having two ends and a length substantially equal to the length of the first upper conductor, one end of the second upper conductor being coupled to another end of the first lower conductor for receiving a signal from the first signal source; and
   a second lower conductor having two ends and a length substantially equal to the length of the first lower conductor, the second lower conductor being parallel to second upper conductor for a substantial part of the length of the second upper conductor, one end of the second lower conductor being coupled to another end of the first upper conductor for receiving a signal from the second signal source.

12. A circuit as in claim 11, wherein the first lower conductor is separated from the second upper conductor and the first upper conductor is separated from the second lower conductor by an insulating layer.

13. A circuit as in claim 12, wherein the first lower conductor is coupled to the second upper conductor through a first hole in the insulating layer and wherein the first upper conductor is coupled to the second lower conductor through a second hole in the insulating layer.

14. A circuit as in claim 13, wherein the first and second lower conductors comprise a first metal.

15. A circuit as in claim 14, wherein the first and second upper conductors comprise a second metal.

16. A circuit comprising:
 a plurality of drive circuits for producing a plurality of signals;
 a first plurality of lower conducting segments connected in series by a second plurality of upper conducting segments, an end of a first lower conducting segment being coupled to one of the drive circuits for receiving one of the signals; and
 a third plurality of upper conducting segments connected in series by a fourth plurality of lower conducting segments, an end of a first upper conducting segment being coupled to one of the drive circuits for receiving one of the signals, each of the first plurality of lower conducting segments being adjacent one of the third plurality of upper conducting segments and each of the second plurality of upper conducting segments being adjacent one of the fourth plurality of lower conducting segments.

17. A circuit as in claim 16, wherein each of the first plurality of conducting segments is spaced apart from the adjacent one of the third plurality of upper conducting segments by a distance less than an allowable spacing between adjacent lower conducting segments.

18. A circuit as in claim 16, wherein the plurality of signals are address signals.

19. A circuit as in claim 16, wherein the plurality of signals are data signals.

20. A circuit as in claim 16, wherein the a plurality of signals are word line signals for selectively activating one of a plurality of rows of memory cells.

21. A circuit as in claim 20, further comprising a plurality of polycrystalline silicon segments, each polycrystalline silicon segment coupled to a plurality of gate terminals of memory cells in the one of a plurality of rows of memory cells, each polycrystalline silicon segment being coupled to one lower conducting segment from the first plurality and fourth plurality of lower conducting segments.

* * * * *